US 6,909,123 B2

(12) United States Patent
Hayashimoto et al.

(10) Patent No.: US 6,909,123 B2
(45) Date of Patent: Jun. 21, 2005

(54) SEMICONDUCTOR LIGHT EMITTING DEVICE WITH REFLECTORS HAVING COOLING FUNCTION

(75) Inventors: Yoshiaki Hayashimoto, Yokohama (JP); Young-Joo Seo, Gyeonggi-do (KR)

(73) Assignee: KYO-A Optics Co., Ltd., Yunghe (TW)

( * ) Notice: Subject to any disclaimer, the term of this patent is extended or adjusted under 35 U.S.C. 154(b) by 69 days.

(21) Appl. No.: 10/445,972

(22) Filed: May 27, 2003

(65) Prior Publication Data

US 2004/0211970 A1 Oct. 28, 2004

(30) Foreign Application Priority Data

Apr. 24, 2003 (KR) .................................. 10-2003-0025980

(51) Int. Cl.⁷ .............................................. H01L 33/00
(52) U.S. Cl. .............................. 257/98; 257/99; 257/100
(58) Field of Search ........................... 257/98–100, 103, 257/89

(56) References Cited

U.S. PATENT DOCUMENTS

| | | | |
|---|---|---|---|
| 5,998,925 A | 12/1999 | Shimizu et al. | 313/503 |
| 6,069,440 A | 5/2000 | Shimizu et al. | 313/486 |
| 6,252,254 B1 | 6/2001 | Soules et al. | 257/89 |
| 6,734,466 B2 * | 5/2004 | Chua | 257/82 |
| 2002/0130326 A1 * | 9/2002 | Tamura et al. | 257/79 |
| 2002/0195935 A1 | 12/2002 | Jager et al. | 313/512 |
| 2003/0006469 A1 | 1/2003 | Ellens et al. | 257/432 |
| 2003/0008431 A1 * | 1/2003 | Matsubara et al. | 438/98 |
| 2003/0038295 A1 | 2/2003 | Koda | 257/98 |

FOREIGN PATENT DOCUMENTS

| | | |
|---|---|---|
| EP | 0936682 | 8/1999 |
| JP | 2900928 | 3/1999 |
| JP | 2927279 | 5/1999 |
| WO | WO01/2385 A1 | 11/2001 |

* cited by examiner

Primary Examiner—Minh-Loan Tran
(74) Attorney, Agent, or Firm—Fredrikson & Byron, PA

(57) ABSTRACT

A semiconductor light emitting device includes a base substrate, lead electrodes provided on the base substrate, at least one semiconductor light emitting element loaded on the base substrate so as to be spaced apart from the lead electrodes and radiating blue light, a connection member for electrically interconnecting the electrodes and the semiconductor light emitting element, a reflector extended from a bottom of the base substrate to a predetermined height for surrounding the semiconductor light emitting element, and a translucent cover layer formed in the receiving space for housing the light emitting element, the translucent cover layer containing a color-shifting substance for absorbing at least a part of blue light radiated from the light emitting element to radiate a light having a different wavelength. The reflector is made of a material having high translucency and high thermal conductivity on a surface thereof so as to reflect the light radiated from the light emitting element and form a uniform planar light, and the reflector radiates the heat radiated from the light emitting element to outside so as to cool an inside of a receiving space for receiving the light emitting element. Thus, the device emits white light outside by combination of the blue light radiated from the light emitting element and the light having a different wavelength.

15 Claims, 5 Drawing Sheets

SEMICONDUCTOR LIGHT EMITTING DEVICE WITH REFLECTORS HAVING COOLING FUNCTION

BACKGROUND OF THE INVENTION

1. Field of the Invention

The present invention relates to a semiconductor light emitting device for emitting white light, and more particularly to a semiconductor light emitting device provided with a reflector for radiating heat generated in light emitting elements to outside.

2. Description of the Related Art

Nowadays, there is developed a light emitting diode (LED) chip using a gallium nitride semiconductor, which may emit blue light of high brightness. When using this gallium nitride semiconductor, the LED has a large output and less color shift in comparison with other LEDs emitting red light or yellowish-green light.

This blue light emitting diode chip is broadly used in various devices such as portable electronic equipment, a sign lamp or an indication lamp. To apply the LED chip to the above-mentioned devices, a point emission should be converted into a planar emission.

For this reason, in the prior art, a chip is installed in front of the LED chip in order to control the direction of the light (International Patent Publication WO98/5078), or a plurality of LED chips are densely arranged to form an array.

However, the dense array of the LED chips or the installation of lens causes the increase of the manufacture costs.

In addition, as the needs for the white light emission increase, there is recently proposed a light emitting device for emitting white light by placing on an LED chip a YAG:CE fluorescent substance which is capable of emitting green light by partially absorbing blue light emitted from the LED chip.

This device emits white light by mixing a YAG fluorescent substance in a sealing resin for sealing the light emitting element. However, this method has a problem that it may not give a satisfactory light output since the light transmission is limited due to the sealing resin.

In order to overcome such a drawback, there is also proposed a light emitting device which realizes white light emission by installing a reflector containing fluorescent substances around the LED chip.

For example, US Patent Publication US2003/0038295A1 discloses a light emitting device which may emit a planar white light of a large output by installing a reflector made of transparent resin and containing fluorescent substances around an light emitting element in order to reflect the blue light radiated from the light emitting element as it is or reflect it after absorbing and then converting the blue light partially into yellow light.

The reflector disclosed in the above US Patent Publication is characterized in that it functions as a fluorescent member as well as a reflecting member. However, the US Patent Publication fails to realize the reflector having a light radiating function.

SUMMARY OF THE INVENTION

Therefore, it is an object of the present invention to provide a light emitting device in which a reflector surrounding a light emitting element is made of a material having excellent thermal conductivity as well as good reflective ratio so that the reflector may radiate heat generated in the LED chip to outside.

Another object of the invention is to provide a light emitting device capable of realizing white light emission of a large output by using silicate (e.g., $SiO_2$) having excellent translucency rather than a conventional transparent resin as a sealing material for sealing the light emitting element.

In addition, still another object of the invention is to improve the uniformity of light by forming a concave reflective surface in an inner side of the reflector.

The inventors was acquainted with the facts that when a side wall is formed around a surface-mounted LED chip to realize strobe light, the heat generated in the LED chip is not effectively emitted outside, thereby shortening the life of the LED and deteriorating the sealing resin or fluorescent substances. In order to solve this problem, the inventors proposes a reflector having a cooling function by forming the side wall by use of metal having excellent thermal conductivity and also forming an insulation film on the surface of the metal.

In addition, the inventors was also acquainted with the fact that it is possible to improve the light output when silicate having good translucency is used for the sealing resin for covering the LED chip.

In one aspect of the present invention, there is provided a semiconductor light emitting device, which includes a base substrate; lead electrodes provided on the base substrate; at least one semiconductor light emitting element loaded on the base substrate so as to be spaced apart from the lead electrodes and radiating blue light; a connection member for electrically interconnecting the electrodes and the semiconductor light emitting element; a reflector extended from a bottom of the base substrate to a predetermined height for surrounding the semiconductor light emitting element, the reflector being made of a material having high translucency and high thermal conductivity on a surface thereof so as to reflect the light radiated from the light emitting element and form a uniform planar light, the reflector also radiating the heat radiated from the light emitting element to outside so as to cool an inside of a receiving space for receiving the light emitting element; and a translucent cover layer formed in the receiving space for housing the light emitting element, the translucent cover layer containing a color-shifting substance for absorbing at least a part of blue light radiated from the light emitting element to radiate a light having a different wavelength.

Thus, the light emitting device may emit white light outside by combination of the blue light radiated from the light emitting element and the light having a different wavelength.

As another aspect of the present invention, there is also provided a semiconductor light emitting device, which includes a base substrate; lead electrodes provided on the base substrate; a light emitting element assembly including at least one semiconductor light emitting element loaded on the base substrate so as to be spaced apart from the lead electrodes and radiating blue light; a connection member for electrically interconnecting the electrodes and the semiconductor light emitting element; and a reflector extended from a bottom of the base substrate to a predetermined height in order to form a receiving space by surrounding the light emitting element assembly, wherein the reflector is made of a material having high translucency and high thermal conductivity on a surface thereof so as to reflect the light radiated from the light emitting element and form a uniform planar light, and wherein the reflector also radiates the heat radiated from the light emitting element to outside so as to cool an inside of the receiving space.

Preferably, the light emitting element assembly includes at lease one LED chip for emitting blue light (B), at least one LED chip for emitting red light (R), and at least one LED chip for emitting green light (G)

Therefore, the device may emit white light outside by R-G-B combination of the mixed lights emitted from the LED chips.

In addition, the reflector is preferably a metal plate having an insulation film formed at least a part of a surface thereof. For example, the reflector is made of aluminum (Al), and the insulation film is made of aluminum oxide ($Al_2O_3$).

Other objects and advantages of the invention will be described below and understood by the embodiments. In addition, the objects and advantages of the invention may be realized by the means disclosed in the attached claims and their combination.

BRIEF DESCRIPTION OF THE DRAWINGS

Other objects and aspects of the present invention will become apparent from the following description of embodiments with reference to the accompanying drawing in which.

DESCRIPTION OF THE PREFERRED EMBODIMENT

Figure 1:
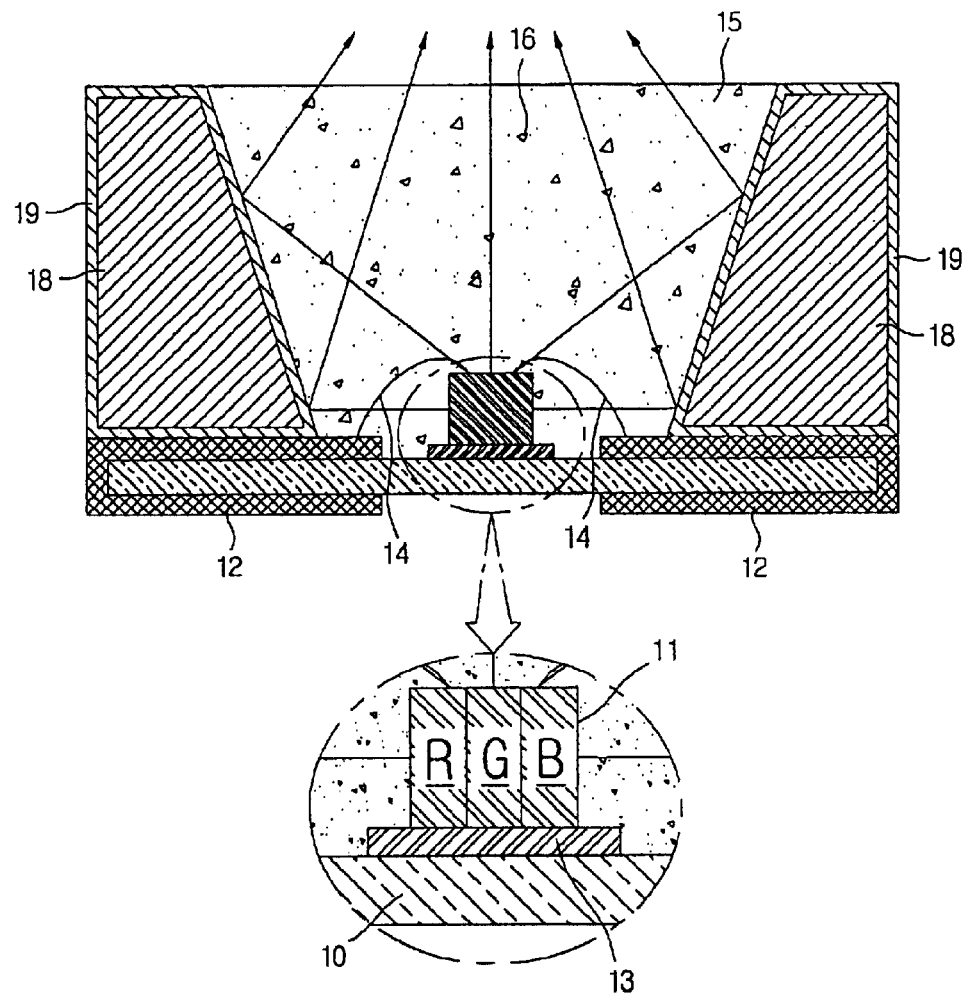
FIG. 1 is a sectional view showing a semiconductor light emitting device according to a first embodiment of the present invention.

Hereinafter, the present invention will be described in more detail referring to the drawings.

First Embodiment

FIG. 1 shows a semiconductor light emitting device according to a first embodiment of the present invention.

As shown in FIG. 1, at least one semiconductor light emitting element 11 is loaded on a base substrate 10, and lead electrodes 12 (e.g., the anode and the cathode) are provided on a bottom of the base substrate 10. The semiconductor light emitting element 11 is spaced apart a predetermined distance from the lead electrodes 12 and die-bonded upon the base substrate 10 by interposing a die-bonding resin 13 (e.g., an epoxy resin).

Electrodes (not shown) of the semiconductor light emitting element 11 and the lead electrodes 12 provided on the base substrate 10 are respectively wire-bonded using wires 14 (e.g., gold wires).

A reflector 18 having a heat radiating function is formed on the bottom of the base substrate 10 so as to surround the light emitting element 11. In case of FIG. 1, the reflector 18 is joined upon the lead electrodes 12 provided on the base substrate 10.

The reflector 18 is extended from the bottom of the base substrate 10 to have a predetermined height for forming a receiving space for receiving the light emitting element 11. Thus, the reflector 18 surrounds the light emitting element 11, and a caliber of the receiving space at its bottom is smaller than that of the top. In addition, there is formed a predetermined gap between edges of the bottom of the reflector 18 and edges of the light emitting element 11.

The receiving space receiving the light emitting element 11 is filled with a transparent sealing resin 15. In addition, the transparent sealing resin 15 is mixed with a color-shifting substance such as a fluorescent material for absorbing a part of the light of a specific wavelength emitted from the light emitting element 11 and then emitting a light of a different wavelength.

Semiconductor Light Emitting Element (11)

The light emitting element used in this embodiment is preferably a gallium nitride light emitting diode (LED) chip emitting blue light having a high output and high brightness. The LED chip 11 of this embodiment may adopt all of homo-, hetero- or double hetero-structure having MIS junction, PIN junction or PN junction.

Such a blue light emitting gallium nitride LED chip is well known in the art, and not described in detail here.

Sealing Resin (15) Mixed with Fluorescent Material

The sealing resin 15 of this embodiment adopts a transparent resin having relatively excellent translucency. For example, a silicon resin may be used for the sealing resin 15. In addition, the fluorescent material mixed in the sealing resin 15 may adopt a YAG:CE fluorescent substance which is capable of absorbing a part of the blue light emitted from the light emitting element and then emitting yellow light.

Reflector (18)

The reflector 18 of this embodiment is preferably made of a metal plate having an insulation film 19 formed at least a part of its surface. If the insulation film 19 is not formed on the surface of the reflector 18, the reflector 18 becomes a conductor itself, thereby breaking the insulation with the electrodes 12 provided on the base substrate 10.

The metal used for the reflector 18 preferably has good light reflecting ability and excellent thermal conductivity. For example, aluminum (Al) or copper (Cu) having relatively good thermal conductivity is suitable for the reflector material of this embodiment. Of course, other metals having good thermal conductivity except Al or Cu may also be used for the reflector of the present embodiment.

In addition, the insulation film 19 formed on the surface of the reflector is formed using the insulative plating or the insulative coating. In particular, the insulation film 19 is preferably an oxide film formed by natural oxidization.

For example, in case of using aluminum (Al) as a material of the reflector, an aluminum oxide ($Al_2O_3$) may be used as the insulation film.

According to the light emitting device of this embodiment constructed as above, a part of the blue light output from the LED chip 11 passes through the sealing resin 15 as it is without any color change or is reflected from the inner surface of the reflector 18 to emit outside. On the while, the other blue light is shifted into yellow light by the fluorescent material 16 in the sealing resin 15, and then passes through the sealing resin 15 or is reflected from the inner surface of the reflector 18 to emit outside.

Therefore, the light emitting device of this embodiment may output white planar light in which the blue light is mixed with the yellow light.

In addition, the heat generated by the LED chip 11 is radiated outside through the reflector 18, so it becomes possible to cool the inside of the receiving space at a constant temperature.

MODIFIED EXAMPLE 1

In this modified example, at least one blue light emitting diode, at least one red light emitting diode and at least one green light diode are formed into an assembly and then this assembly is mounted on the base substrate 10 in the receiving space formed by the reflector 18, differently from the first embodiment in which only blue light emitting diode are mounted in the receiving space. This modification is illustrated in the inset diagram of FIG. 1.

In other words, the light emitting device of this modified example realizes white light by combination of the red-, blue- and green-light (i.e., R-G-B combination) emitted from the red-, blue- and green-light emitting diodes. Thus, this modified example does not require to mix any color-shifting substance 16 such as a fluorescent material into the sealing resin 15 charging the inside of the receiving space as in the case of the first embodiment.

The red-, blue- and green-light emitting diodes composing the assembly may be arranged in series along the base substrate, or disposed to a certain angle between them (e.g., disposed at each corner of a right triangle).

Other components of this modified example such as the reflector 18, the base substrate 10, the sealing resin 15, the conductive wire 14, the lead electrodes 12 and the die-bonding resin 13 are substantially identical to those of the first embodiment.

Second Embodiment

Figure 2:
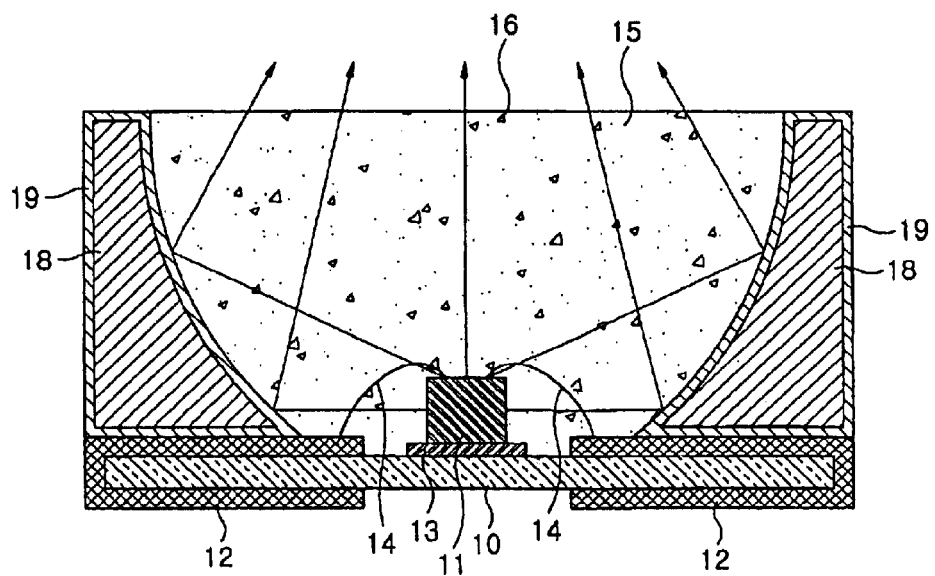
FIG. 2 is a sectional view showing a semiconductor light emitting device according to a second embodiment of the present invention.

FIG. 2 shows a semiconductor light emitting device according to a second embodiment of the present invention.

The light emitting device of this embodiment is substantially identical to the device of the first embodiment, except of the configuration of the reflector 18. Thus, the following description is just focused on the reflector 18 having different configuration to the first embodiment, and other components are not described in detail.

Reflector (18)

As shown in FIG. 2, the reflector 18 according to this embodiment is an inner surface formed concave, differently from the first embodiment. Thus, the reflector 18 of this embodiment forms a concave reflective surface. In other words, an end surface of the receiving space forms a symmetric parabola surface or a symmetric oval surface.

In case the inner surface of the reflector has the concave reflective surface as described above, the reflected light is better collected than a flat reflective surface, which makes it possible to output a regular planar light.

MODIFIED EXAMPLE 2

This modified example is substantially identical to the second embodiment, except that the light emitting diode assembly is disposed in the receiving space, and the transparent sealing resin not mixed with the color-shifting material is used like the modified example 1.

Third Embodiment

Figure 3:
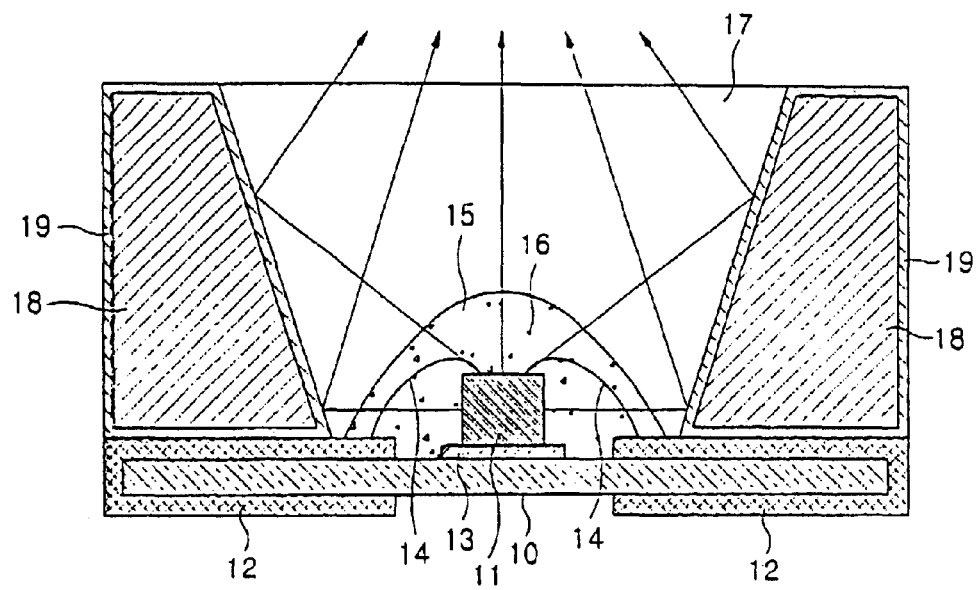
FIG. 3 is a sectional view showing a semiconductor light emitting device according to a third embodiment of the present invention.

FIG. 3 shows a semiconductor light emitting device according to a third embodiment of the present invention.

The light emitting device of this embodiment is substantially identical to the first embodiment, except the configuration of translucent cover layers 15 and 17. Thus, the following description is mainly focused on the configuration of the translucent cover layers 15 and 17, differently from the first embodiment, and other components are not described in detail.

As shown in FIG. 3, the translucent cover layers 15 and 17 are formed in two stages, differently from the sealing resin 15 of the first embodiment.

First Translucent Cover Layer (15)

The first translucent cover layer 15 houses the entire LED chip 11 with forming a certain gap with bottom edges of the reflector 18. Thus, the LED chip 11 is buried in the first translucent cover layer 15 in this case.

The first translucent cover layer 15 is preferably made of silicate (particularly, $SiO_2$) having relatively better translucency and cheaper than the sealing resin of the first embodiment.

In addition, the silicate 15 contains a fluorescent material (or, phosphorescent material) 16 for absorbing a part of the blue light emitted from the LED chip 11 and then shifting it into yellow color, or a color-shifting material 16 such as pigment in order to make white light on the basis of the blue light.

The first translucent cover layer 15 is formed by spraying the silicate containing the fluorescent material or the pigment by use of a dispenser after surface-mounting of the LED chip 11 on the substrate and wire-bonding.

Second Translucent Cover Layer (17)

The second translucent cover layer 17 is formed on the first translucent cover layer 15, and fills the receiving space between the first translucent cover layer 15 and the reflector 18.

The second translucent cover layer 17 may be made using only a transparent resin such as a silicon resin, as an example. In addition, the second translucent cover layer 17 may additionally contain a color-shifting material, which is mixed into the first translucent cover layer.

In this embodiment, the translucent cover layer for housing the LED chip 11 is formed in two stages, differently from the first embodiment. In particular, the first translucent cover layer 15 formed near the LED chip 11 is made using the silicate having relatively good translucency and cheap, so the light emitting device of this embodiment may give a large output at a low cost.

Fourth Embodiment

Figure 4:
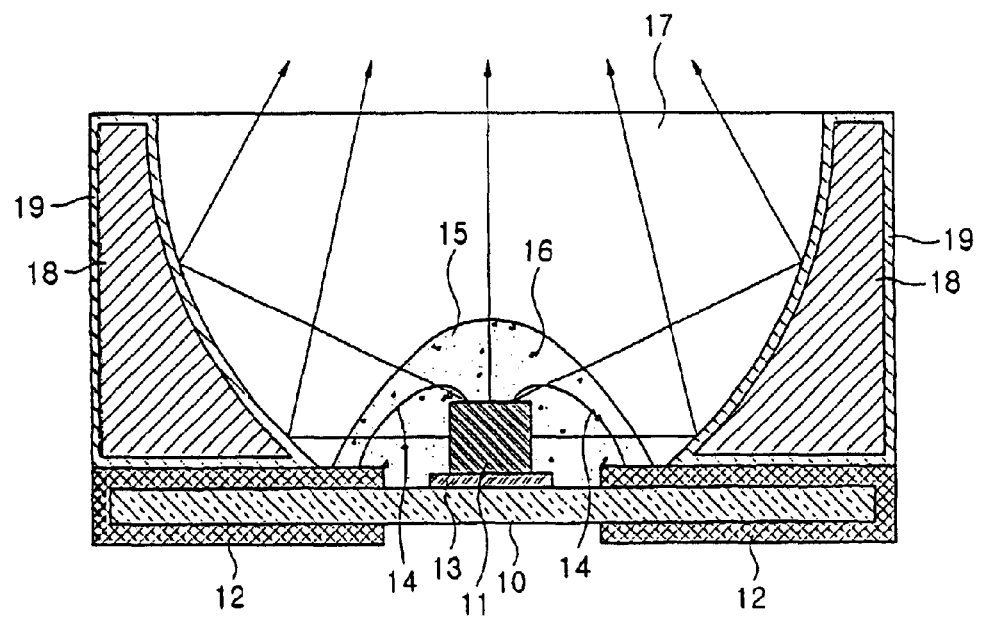
FIG. 4 is a sectional view showing a semiconductor light emitting device according to a fourth embodiment of the present invention.

FIG. 4 shows a semiconductor light emitting device according to a fourth embodiment of the present invention.

The light emitting device of this embodiment is substantially identical to the first embodiment, except the configuration of the reflector 18 and the translucent cover layers 15 and 17. Thus, the following description is mainly focused on the configuration of the reflector 18 and the translucent cover layers 15 and 17, differently from the first embodiment, and other components are not described in detail.

Reflector (18)

As shown in FIG. 4, the reflector 18 according to this embodiment is an inner surface formed concave, differently from the first embodiment. Thus, the reflector 18 of this embodiment forms a concave reflective surface. In other words, an end surface of the receiving space forms a symmetric parabola surface or a symmetric oval surface.

In addition, as shown in FIG. 4, the translucent cover layers 15 and 17 according to the present embodiment are formed in two stages, differently from the sealing resin 15 of the first embodiment.

First Translucent Cover Layer (15)

The first translucent cover layer 15 houses the entire LED chip 11 with forming a certain gap with bottom edges of the reflector 18. Thus, the LED chip 11 is buried in the first translucent cover layer 15 in this case.

The first translucent cover layer 15 is preferably made of silicate (particularly, $SiO_2$) having relatively better translucency and cheaper than the sealing resin of the first embodiment.

In addition, the silicate 15 contains a fluorescent material (or, phosphorescent material) 16 for absorbing a part of the blue light emitted from the LED chip 11 and then shifting it into yellow color, or a color-shifting material 16 such as pigment in order to make white light on the basis of the blue light.

The first translucent cover layer 15 is formed by spraying the silicate containing the fluorescent material or the pigment by use of a dispenser after surface-mounting of the LED chip 11 on the substrate and wire-bonding.

Second Translucent Cover Layer (17)

The second translucent cover layer 17 is formed on the first translucent cover layer 15, and fills the receiving space between the first translucent cover layer 15 and the reflector 18.

The second translucent cover layer 17 may be made using only a transparent resin such as a silicon resin, as an example. In addition, the second translucent cover layer 17 may additionally contain a color-shifting material, which is mixed into the first translucent cover layer.

In this embodiment, the translucent cover layer for housing the LED chip 11 is formed in two stages, differently from the first embodiment. In particular, the first translucent cover layer 15 formed near the LED chip 11 is made using the silicate having relatively good translucency and cheap, so the light emitting device of this embodiment may give a large output at a low cost.

In addition, since the inner surface of the reflector according to this embodiment has the concave reflective surface as described above, the reflected light is better collected than a flat reflective surface, which makes it possible to output a regular planar light.

Hereinafter, a method for making the light emitting device mentioned in the above embodiments is described.

The method for making the light emitting device of the present invention is well shown in FIGS. 5a to 5f.

The method of the present invention is helpful for the mass production of the qualified light emitting devices as described in the fourth embodiment.

In this making method, a plurality of packages are processed in a bundle until the translucent cover layer 15 and/or 17 covers the LED chip 11, so a package assembly in which a plurality of the packages are collected is used in the method.

But, the making method of the present invention is just explained on the basis of a package unit for the sake of easier understanding in the following description.

Figure 5A:
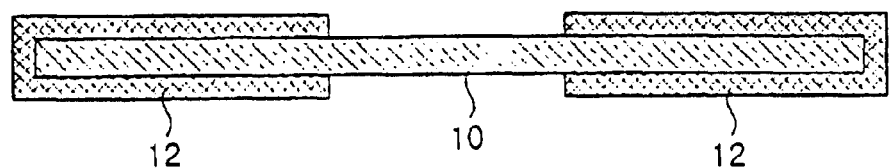
FIGS. 5a to 5f are sectional views for illustrating the process for making the semiconductor light emitting device according to fourth first embodiment.

(a) Manufacture of the Base Substrate (10) on Which the LEAD Electrodes (12) are Formed (see FIG. 5a)

The positive (+) and negative (−) lead electrodes 12 are formed by use of a metal having good electric conductivity on the thin base substrate (e.g., PCB).

Figure 5B:
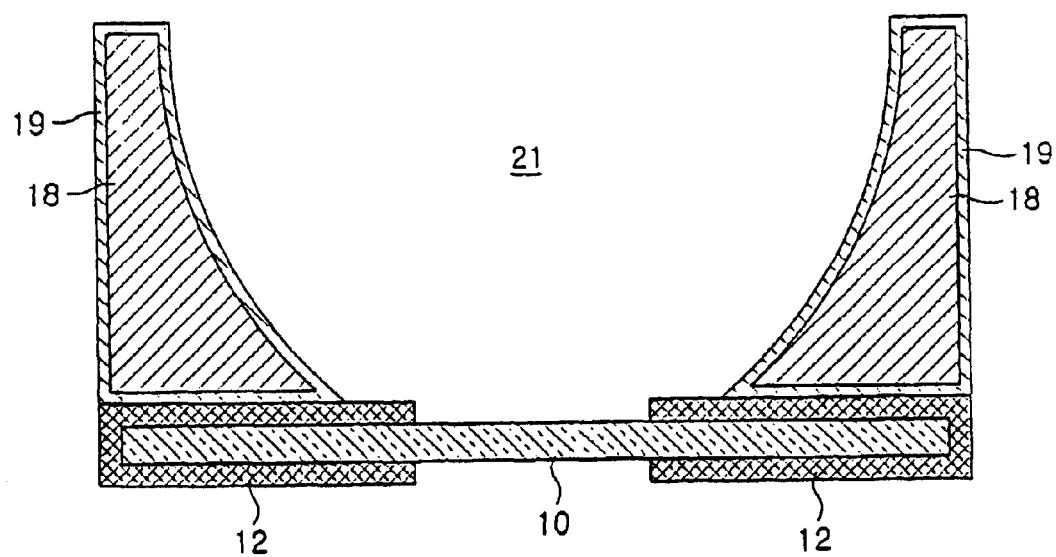

(b) Junction of the Metal Substrate (18) having a Through Hole (21) (see FIG. 5b)

A thin metal plate (e.g., an aluminum or copper plate) is prepared, and then a through hole 21 as shown in FIG. 5b is formed in the metal plate 18 by using a processing manner such as chemical etching, laser processing, molding or pressing. A cross section of this through hole 21 may have an oval, circular or rectangular shape. In other words, the present invention is not limited by the cross-sectional shape of the through hole 21, and it may be selected among various shapes. In addition, the through hole 21 has a tilted side wall so that a caliber of the through hole 21 increases from one side of the metal plate 18 (e.g., a side contacted with the base substrate) to an opposite side. If the side wall of the through hole 21 is tilted, the light output from the LED chip 11 toward the side wall of the through hole 21 is reflected upward due to the tilted side wall, so the light output from the LED chip 11 may be effectively output out of the light emitting device.

In addition, the through hole 21 is preferably processed so that its end side forms a symmetric parabola surface or a symmetric oval surface as shown in FIG. 5b. If the side wall of the through hole 21 is rounded concave as mentioned above, the concave reflective surface is formed to easily collect the reflected light, thereby forming more uniform planar light.

If the metal plate 18 having the through hole 21 is united on the base substrate 10 as described in FIG. 5b, the lead electrodes 12 and the base substrate 10 in each package are partially exposed in the through hole 21.

Figure 5C:
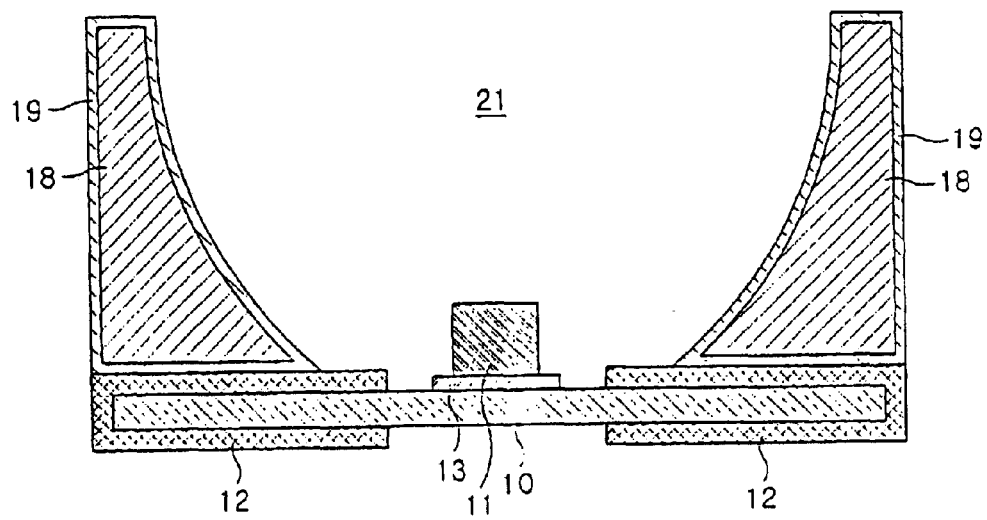

(c) Mounting of LED Chip (11) (see FIG. 5c)

The LED chip 11 is die-bonded at a predetermined position of the through hole 21 of the package unit of the package assembly configured as above by use of the die-bonding resin 13.

Figure 5D:
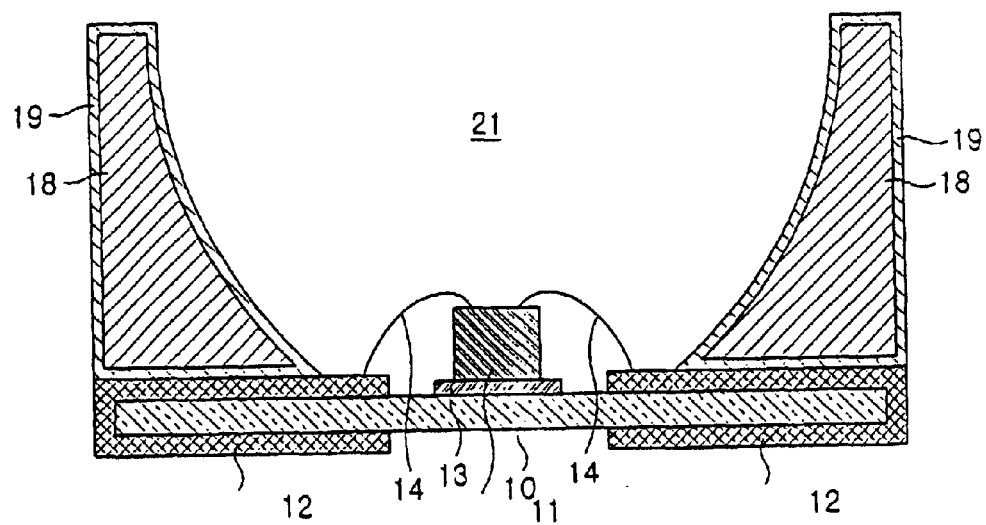

(d) Wire-Bonding (see FIG. 5d)

The positive and negative lead electrodes 12 and P-type electrode (not shown) and N-type electrode (not shown) of the LED chip 11 exposed in the through hole 21 are wire-bonded using the conductive wire 14 for wiring.

Figure 5E:
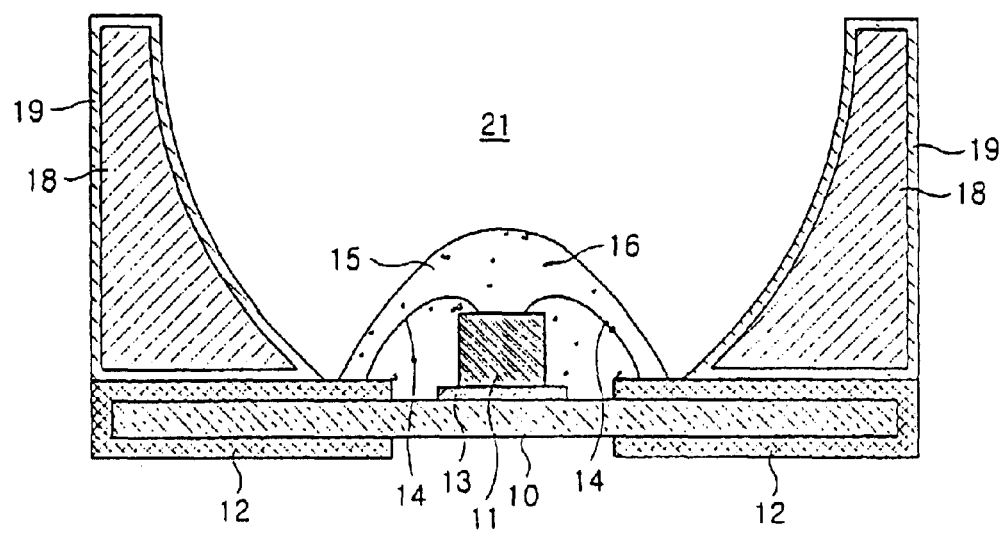

(e) Forming of First Translucent Cover Layer (15) (see FIG. 5e)

The silicate (particularly, $SiO_2$) containing the color-shifting material 16 (e.g., fluorescent material or pigment) is sprayed on the upper surface of the wired LED chip 11 by use of a dispenser so as to form the first translucent cover layer 15 for housing the entire LED chip.

Figure 5F:
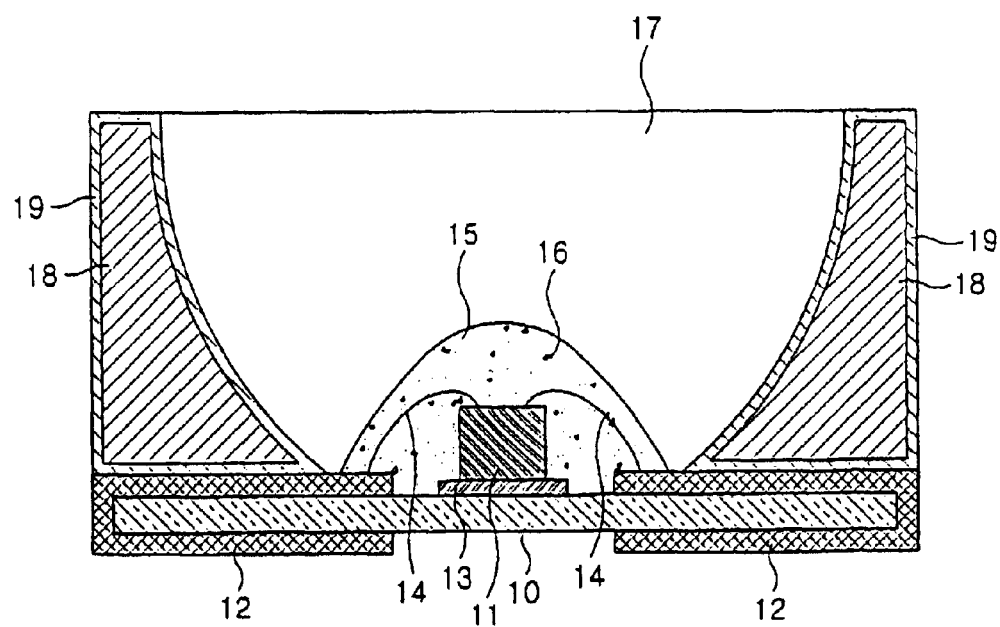

(f) Forming of Second Translucent Cover Layer (17) (see FIG. 5f)

The transparent resin containing the transparent resin such as a silicon resin or the color-shifting material (e.g., fluorescent material or pigment) is filled in the through hole 21 on which the first translucent cover layer 15 in order to form the second translucent cover layer 17.

By conducting the processes shown in FIGS. 5a to 5f, a package assembly configuring a plurality of package units is manufactured. This package assembly is then divided into each package unit so as to finally make the semiconductor light emitting device as shown in FIG. 4.

Though there is introduced the method for making the light emitting device of the fourth embodiment with reference to FIGS. 5a to 5f, the similar processes may be applied to the first, second and third embodiments (or, the modified examples 1 and 2), of course.

APPLICABILITY TO THE INDUSTRY

The light emitting device according to the present invention may effectively radiate the heat generated in the LED chip to outside by configuring the reflector made of metal having high thermal conductivity around the LED chip mounted on the substrate. Thus, the light emitting device of the present invention may keep a temperature of the receiving space for receiving the LED chip below a certain criteria.

In addition, since the LED chip is sealed using the silicate resin having better translucency than the conventional transparent resin, the light emitting device may emit white light of a large output.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. A semiconductor light emitting device comprising:
   a base substrate;
   lead electrodes provided on the base substrate;
   at least one semiconductor light emitting element loaded on the base substrate so as to be spaced apart from the lead electrodes and radiating blue light;
   a connection member for electrically interconnecting the lead electrodes and the semiconductor light emitting element;
   a reflector extended from a surface of the base substrate to a predetermined height for surrounding the semiconductor light emitting element, the reflector being made of a metal plate having an insulation film formed on at least a part of a surface thereof so as to reflect the light radiated from the light emitting element and form a uniform planar light, having high reflectance and high thermal conductivity, the reflector discharging the heat radiated from the light emitting element to outside so as to cool an inside of a receiving space for receiving the light emitting element; and
   a translucent cover layer formed in the receiving space for housing the light emitting element, the translucent cover layer containing a color-shifting substance for absorbing at least a part of blue light radiated from the light emitting element to radiate a light having a different wavelength,
   whereby the device emits white light by combination of the blue light radiated from the light emitting element and the light having a different wavelength.

2. A semiconductor light emitting device according to claim 1, wherein the reflector is made of aluminum (Al), and the insulation film is made of aluminum oxide ($Al_2O_3$).

3. A semiconductor light emitting device according to claim 2, wherein an inner surface of the reflector adjacent to the receiving space is tilted from the bottom of the base substrate at a predetermined angle, whereby a caliber of the receiving space is gradually increased from a bottom contacted with the base substrate to an opposite side.

4. A semiconductor light emitting device according to claim 2, wherein an inner surface of the reflector is rounded concave so that an end side of the receiving space substantially forms a symmetric parabola surface or a symmetric oval surface.

5. A semiconductor light emitting device according to claim 4, wherein the semiconductor light emitting element is a blue light emitting diode using a nitride semiconductor.

6. A semiconductor light emitting device according to claim 5, wherein the translucent cover layer is made of a transparent resin containing a fluorescent material which absorbs a part of the blue light emitted from the light emitting element and then emits yellow light, wherein the receiving space is filled with the transparent resin.

7. A semiconductor light emitting device according to claim 5, wherein the translucent cover layer includes: a first translucent cover layer disposed near the light emitting element and containing a color-shifting substance for emitting yellow light by absorbing a part of the blue light emitted from the light emitting element; and a second translucent cover layer formed on the first translucent cover layer to fill the receiving space, the second translucent cover layer being made of a transparent resin for transmitting the light passing through the first translucent cover layer to outside.

8. A semiconductor light emitting device according to claim 7, wherein the first translucent cover layer is made of a silicate resin containing a color-shifting substance.

9. A semiconductor light emitting device according to claim 7, wherein the second translucent cover layer has a fluorescent substance for absorbing a part of the blue light emitted from the light emitting element and then emitting yellow light.

10. A semiconductor light emitting device comprising:
    a base substrate;
    lead electrodes provided on the base substrate;
    a light emitting element assembly including at least one semiconductor light emitting element loaded on the base substrate so as to be spaced apart from the lead electrodes and radiating blue light;
    a connection member for electrically interconnecting the lead electrodes and the semiconductor light emitting element; and
    a reflector extended from a surface of the base substrate to a predetermined height in order to form a receiving space by surrounding the light emitting element assembly,
    wherein the reflector is made of a metal plate having an insulation film formed on at least a part of a surface thereof so as to reflect the light radiated from the light emitting element and form a uniform planar light, whereby the reflector has high reflectance and high thermal conductivity, and discharges the heat radiated from the light emitting element to outside so as to cool an inside of the receiving space.

11. A semiconductor light emitting device according to claim 10, wherein the light emitting element assembly includes at lease one LED chip for emitting blue light (B), at least one LED chip for emitting red light (R), and at least one LED chip for emitting green light (G), whereby the device emits white light outside by R-G-B combination of the mixed lights emitted from the LED chips.

12. A semiconductor light emitting device according to claim 10, wherein the reflector is made of aluminum (Al), and the insulation film is made of aluminum oxide ($Al_2O_3$).

13. A semiconductor light emitting device according to claim 12, wherein an inner surface of the reflector adjacent to the receiving space is tilted from the bottom of the base substrate at a predetermined angle, whereby a caliber of the receiving space is gradually increased from a bottom contacted with the base substrate to an opposite side.

14. A semiconductor light emitting device according to claim 12, wherein an inner surface of the reflector is rounded concave so that an end side of the receiving space substantially forms a symmetric parabola surface or a symmetric oval surface.

15. A semiconductor light emitting device according to claim 10, further comprising a transparent resin layer filled in the receiving space for housing the light emitting element assembly.

* * * * *